United States Patent [19]

Chao

[11] Patent Number: 5,773,335
[45] Date of Patent: Jun. 30, 1998

[54] METHOD FOR FORMING TWIN-TUB WELLS IN SUBSTRATE

[75] Inventor: Fang-Ching Chao, Hsinchu, Taiwan

[73] Assignee: United Microelectronics Corp., Taiwan

[21] Appl. No.: 700,161

[22] Filed: Aug. 20, 1996

[51] Int. Cl.$^6$ ............................................. H01L 21/8238
[52] U.S. Cl. ........................... 438/199; 438/787; 438/919
[58] Field of Search .................................. 438/199, 919, 438/787

[56] References Cited

U.S. PATENT DOCUMENTS

| | | | |
|---|---|---|---|
| 4,613,885 | 9/1986 | Haken | 437/57 |
| 5,024,961 | 6/1991 | Lee et al. | 437/57 |
| 5,047,356 | 9/1991 | Li et al. | 437/21 |
| 5,134,085 | 7/1992 | Gilgen et al. | 437/57 |
| 5,411,899 | 5/1995 | Lee et al. | 437/34 |
| 5,525,823 | 6/1996 | Chan | 437/57 |
| 5,543,252 | 8/1996 | Shibata et al. | 430/5 |

FOREIGN PATENT DOCUMENTS

| | | | |
|---|---|---|---|
| 0046552 | 2/1987 | Japan | 437/34 |
| 0072661 | 3/1990 | Japan | 437/56 |
| 406140589 | 5/1994 | Japan | 437/57 |

Primary Examiner—John Niebling
Assistant Examiner—Long Pham
Attorney, Agent, or Firm—George P. Hoare, Jr.; Rogers & Wells LLP

[57] ABSTRACT

A method for forming twin-tub wells in a semiconductor substrate is disclosed. The present invention includes forming a first silicon oxide layer on the substrate. A silicon nitride layer is patterned on a portion of the first silicon oxide layer by a photoresist mask. First-type ions are implanted over the substrate not covered by the silicon nitride layer. Next, a second silicon oxide layer formed by a liquid phase deposition method is deposited on a portion of the first silicon oxide layer not covered by the silicon nitride layer. After the silicon nitride layer is removed, second-type ions are implanted over the substrate not covered by the second silicon oxide layer. Finally, the substrate is drived-in such that a first-type well and a second-type well are formed under the first silicon oxide layer.

9 Claims, 8 Drawing Sheets

METHOD FOR FORMING TWIN-TUB WELLS IN SUBSTRATE

BACKGROUND OF THE INVENTION

1. Field of the Invention

The present invention relates to a method for forming twin-tub wells in a semiconductor substrate, and more particularly to a method for forming twin-tub wells with a planar surface.

2. Description of the Prior Art

Conventional complementary metal-oxide-semiconductor (CMOS) device is realized by forming n-channel devices in p-wells, which are formed by diffusing p-type atoms such as boron atoms into an n-type substrate. The p-channel devices are formed outside the p-wells. FIG. 1A to 1C illustrate a conventional method for forming a p-well CMOS device. Referring to FIG. 1A a mask 10 is used to define a p-well region, and boron atoms are implanted into a substrate 12, followed by a high-temperature drive-in step to form the p-well 16 as shown in FIG. 1B. Next, a silicon nitride layer (not shown) is deposited and patterned over the active regions. Referring to FIG. 1C. a local oxidation of silicon (LOCOS) method is used to form thick oxide fields 14 among the active regions. The structure thus formed as shown in FIG. 1C will be used for forming an n-channel device in the p-well 16, and forming a p-channel device directly in the n-type substrate 12.

As shown in FIG. 2A, another architecture called n-well structure for forming a CMOS transistor was disclosed for forming p-channel devices in n-wells formed by diffusing n-type atoms such as phosphorus atoms into a p-type substrate 22 using a mask 20 to define an n-well region. A drive-in process is used to form the n-well 26 as shown in FIG. 2B. Thereafter, a silicon nitride layer (not shown) is deposited and patterned over the active regions. Next, referring to FIG. 2C, a local oxidation of silicon (LOCOS) method is used to form thick oxide fields 24 among the active regions. The structure of FIG. 2C will then be used for forming a p-channel device in the n-well 26, and forming an n-channel device directly in the p-type substrate 22. The choice of the well type as mentioned above depends largely on circuit application. For example, the n-well is suitable for fabricating dynamic random access memories (DRAMs) because the p-channel devices have low substrate current whereas the high substrate devices can be easily sunk from the p-type substrate.

A twin-tub process was further disclosed. See L. C. Parrillo, et al., "Twin-tub CMOS: A technology for VLSI circuits," in *IEDM Tech. Dig.*, p. 752, 1980. In this scheme, the doping profiles in each well could be set independently to optimize both device types. In addition. this process produces better devices than the n-well and the p-well processes for its lower junction capacitance and less body effect. Further, there is a flexibility of selecting substrate type without affecting performance. FIG. 3A to 3B illustrate the process sequence of the conventional twin-tub process. In FIG. 3A, a patterned silicon nitride 30 and a silicon oxide 32 are used to mask a phosphorus implant for an n-well. The substrate 34 is then subject to a thermal oxidation to form a masking oxide 36, and the n-well 38 is thus formed as shown in FIG. 3B. Subsequently, boron atoms are implanted using the masking oxide 36 as a block, followed by a drive-in step to form a p-well 39 as shown in FIG. 3C. One of the advantages of using the twin-tub process is that a self-aligned twin-tub structure can be achieved using only one mask.

Unfortunately, the resultant twin-tub structure of FIG. 3C has a non-planar surface with height difference as large as about 2000 angstroms. Although the height difference is useful for the following lithographic processes for fabricating devices, the large difference makes the transitional area between the p-well 39 and the n-well 38 wasteful, and therefore the conventional twin-tub structure is not appropriate for fabricating sub-micron high-density circuits. Furthermore, this process requires two drive-in steps for forming the n-well and the p-well respectively. Because of the lower diffusing rate of the phosphorus atoms, the n-well must be formed firstly at a higher temperature (about 1200° C.), followed by the implant of boron atoms having higher diffusing rate at a lower temperature (about 1150° C.). This required sequence of the drive-in steps makes the twin-tub process inflexible.

SUMMARY OF THE INVENTION

A method for forming twin-tub wells in a semiconductor substrate is disclosed. The present invention includes the following steps: forming a first silicon oxide layer on the substrate : patterning a silicon nitride layer on a portion of the first silicon oxide layer by a photoresist mask; implanting first-type ions over the substrate not covered by the silicon nitride layer; forming a second silicon oxide layer by a liquid phase deposition method on a portion of the first silicon oxide layer not covered by the silicon nitride layer; removing the silicon nitride layer; implanting second-type ions over the substrate not covered by the second silicon oxide layer; and driving-in the substrate such that a first-type well is formed under the first silicon oxide layer covered by the second silicon oxide layer, and a second-type well is formed under the first silicon oxide layer not covered by the second silicon oxide layer.

DESCRIPTION OF THE PREFERRED EMBODIMENT

Figure 1A:
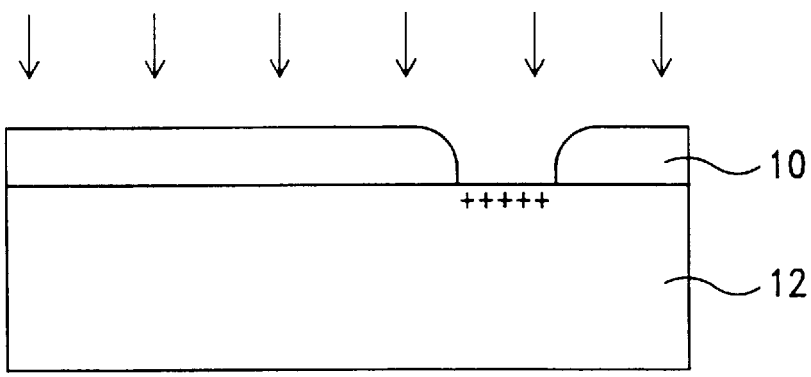
FIG. 1A to 1C illustrate a conventional method for forming a p-well CMOS device.
Figure 1B:
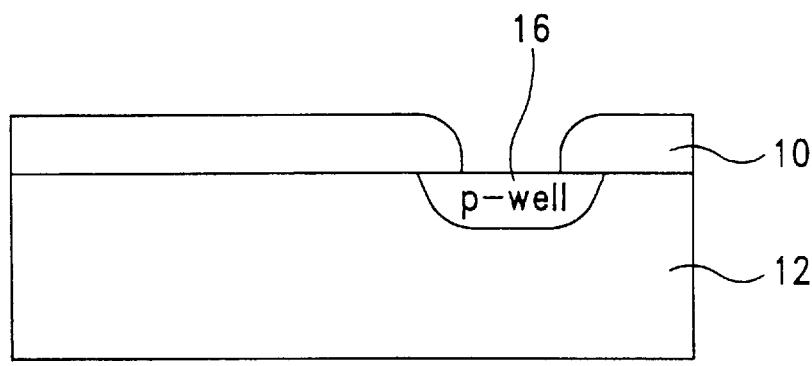
Figure 1C:
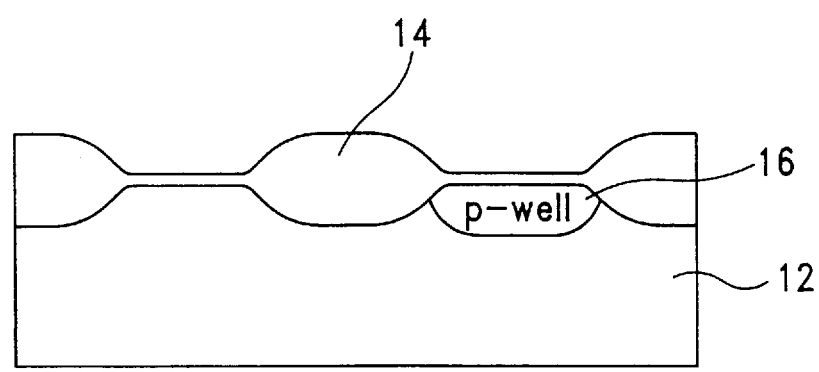
Figure 2A:
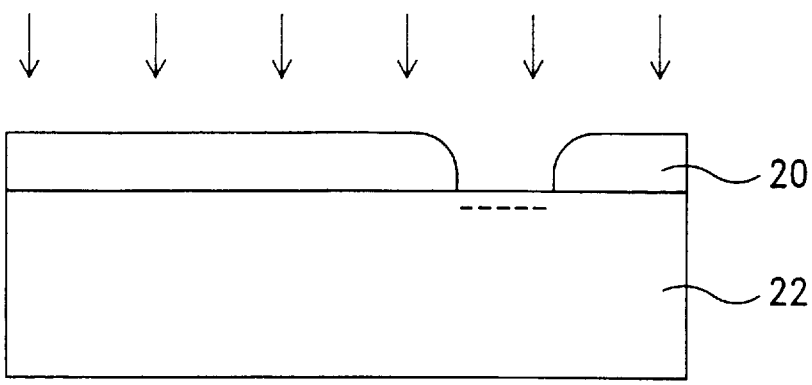
FIG. 2A to 2C illustrate a conventional method for forming an n-well CMOS device.
Figure 2B:
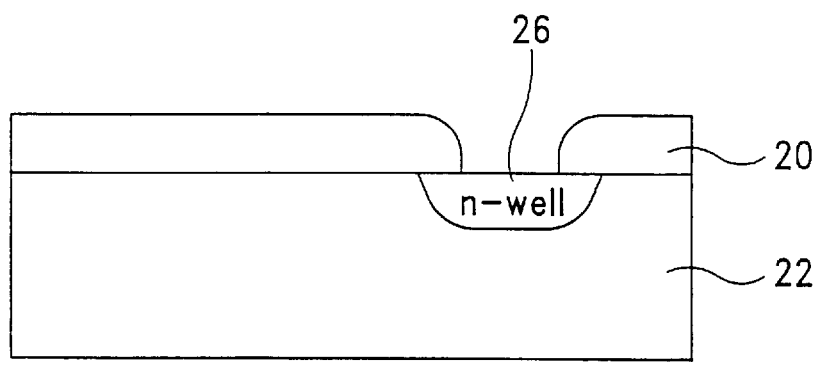
Figure 2C:
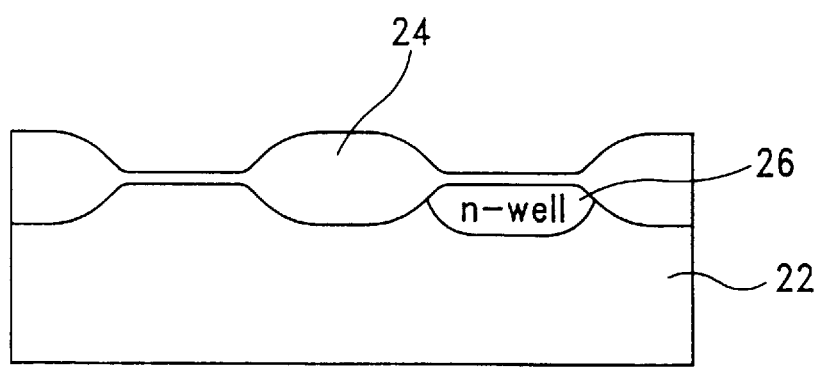
Figure 3A:
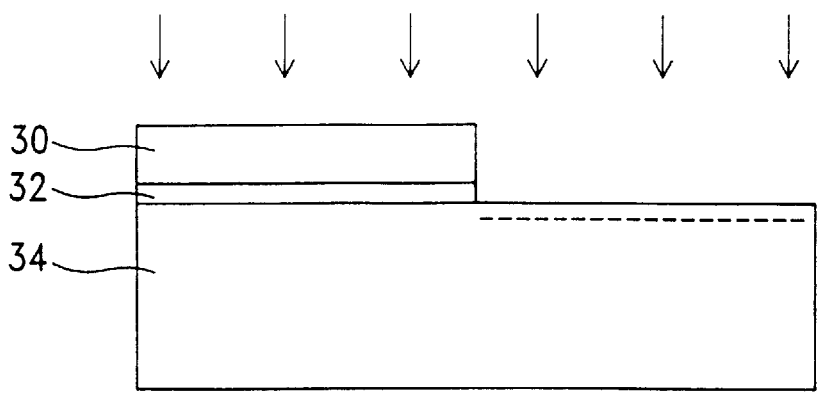
FIG. 3A to 3C illustrate the process sequence of the conventional twin-tub process.
Figure 3B:
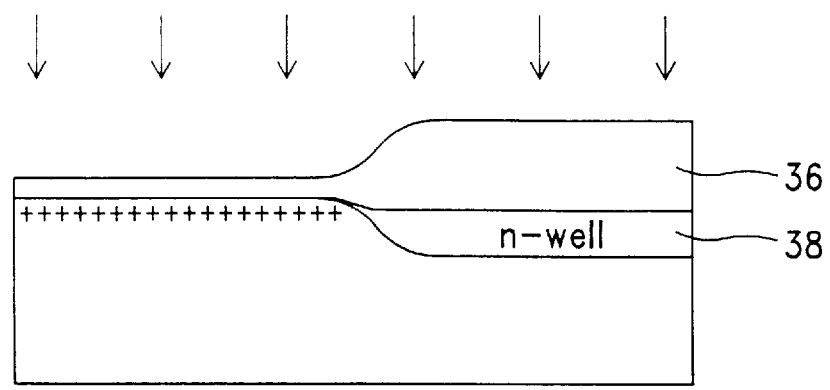
Figure 3C:
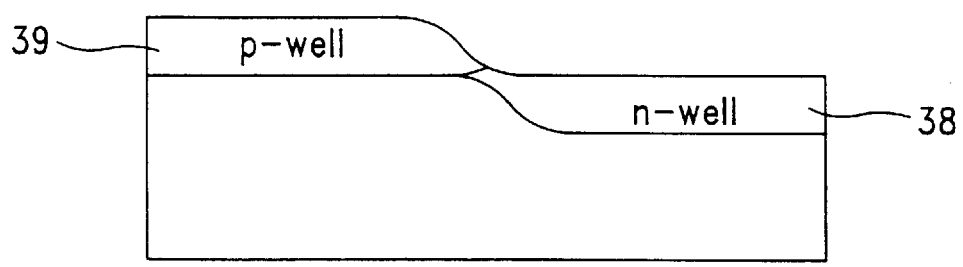
Figure 4A:
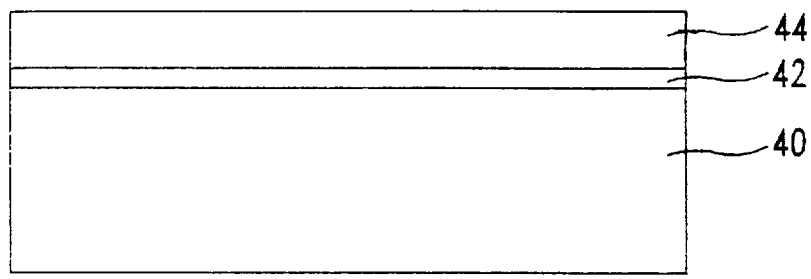
FIG. 4A to 4F illustrate schematically the cross-sections of the structure formed at various stages in forming the twin-tub wells in a semiconductor substrate according to one of the preferred embodiments of the present invention.

FIG. 4A to 4F illustrate schematically the cross-sections of the structure formed at various stages in forming twin-tub wells in a semiconductor substrate according to one of the preferred embodiments of the present invention. FIG. 4A shows a schematic cross-section of a silicon substrate 40, which is n or p type, having thereon a silicon oxide layer 42 of 300~1000 angstroms in thickness. This silicon oxide layer 42 can be grown by using a conventional thermal oxidation process at about 900°~1100° C. Alternatively, the silicon oxide layer 42 can be formed by a chemical vapor deposition (CVD) method at a temperature as low as 400° C. A common method to deposit silicon oxide is oxidizing silane with oxygen at low pressure and low temperature (typically 400 ~450° C.), and decomposing tetraethylorthosilicate (Si($C_2H_5O$)$_4$), also referred to as tetraethoxysilane (TEOS), at low pressure and at a temperature of about 650°~750° C. Thereafter, on top of the silicon oxide layer 42 is a silicon nitride layer 44 having a thickness of about 1000~3000 angstroms. This silicon nitride layer 44 will work as a mask to block implanted ions which will be described later in conjunction with FIG. 4C. The silicon nitride layer 44 can be deposited by reacting silane with ammonia at about 700°~900° C. and at atmospheric pressure as follow:

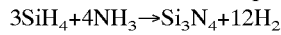
$3SiH_4 + 4NH_3 \rightarrow Si_3N_4 + 12H_2$

The silicon nitride layer 44 can alternatively be formed using a low pressure chemical vapor deposition (LPCVD) process by the reaction of dichlorosilane and ammonia at a temperature of about 700°~800 CC as follow:

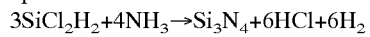
$3SiCl_2H_2 + 4NH_3 \rightarrow Si_3N_4 + 6HCl + 6H_2$

Although a silicon nitride layer 44 is used as mentioned above, other dielectric layer such as a polysilicon layer can be used instead. The polysilicon is typically deposited at low pressure (0.2~1.0 torr) by the pyrolitic decomposition of silane at 550°~650° C., following the reaction:

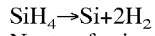
$SiH_4 \rightarrow Si + 2H_2$

Figure 4B:
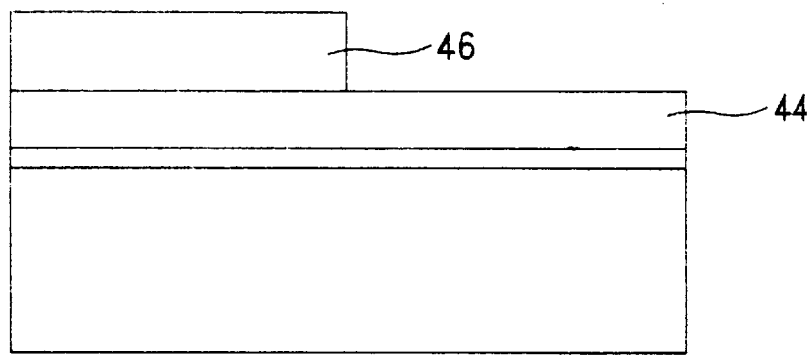

Next, referring to FIG. 4B, a pattern process is performed by applying a photoresist masking layer 46, covering a portion of the silicon nitride layer 44. This pattern process is defined using a standard photoresist coating, an exposure process and a development process. Afterward, the portion of the silicon nitride layer 44 not covered by the photoresist mask 46 is etched in a boiling phosphoric acid solution (85% $H_3PO_4$ at about 180° C.), forming the structure as shown in FIG. 4C.

Figure 4C:
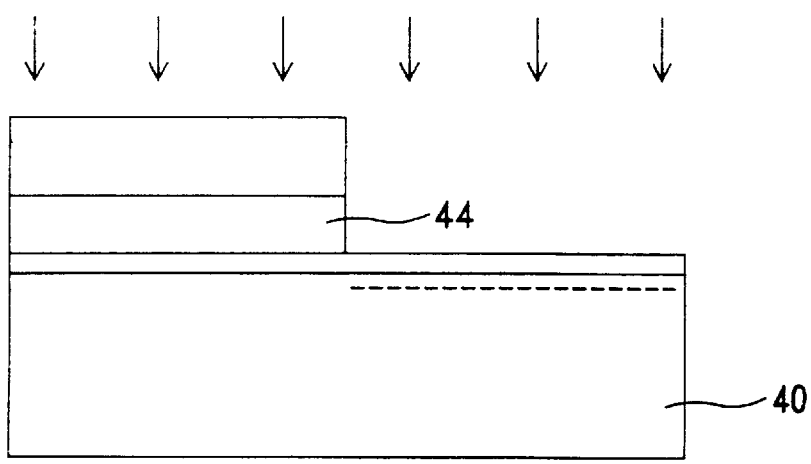

In FIG. 4C, first-type ions such as the n-type ions of phosphorus are implanted into the substrate 40 at 50~200 KeV with a dosage of about $1\times10^{18}$~$3\times10^{18}$ atoms/cm$^2$ using the silicon nitride layer 44 as a block.

Figure 4D:
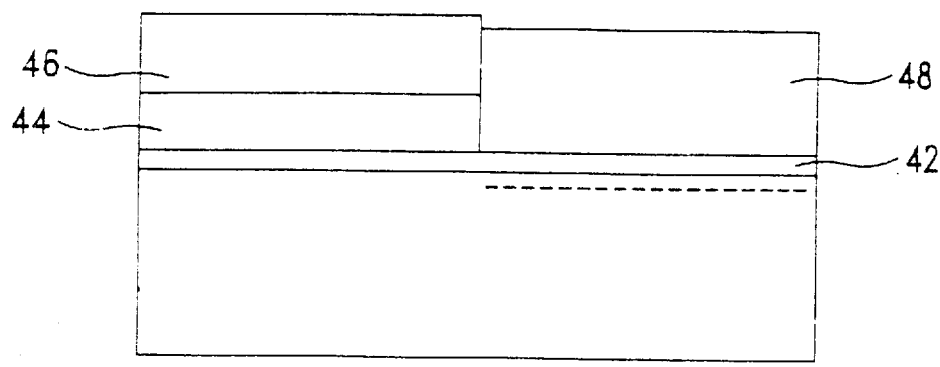
Figure 5:
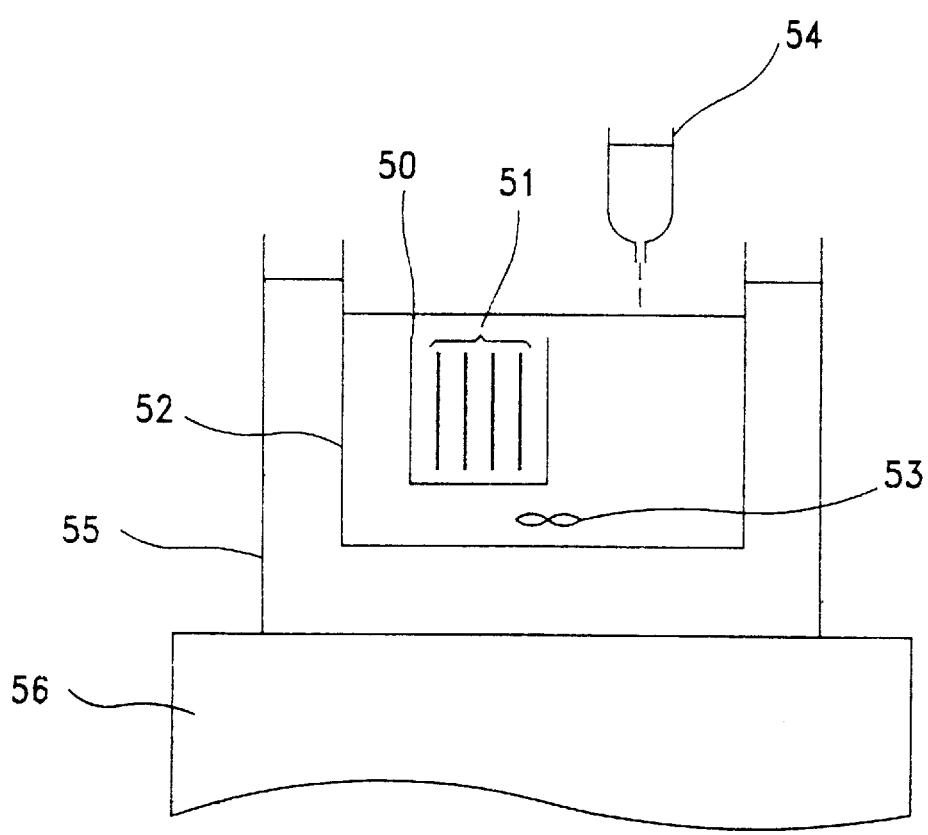
FIG. 5 schematically shows a liquid phase deposition device.

As illustrated in FIG. 4D, a thick silicon oxide layer 48 is selectively deposited on the silicon oxide layer 42 not covered by the silicon nitride layer 44 by a liquid phase deposition (LPD) method. Owing to its high deposition selectivity, the LPD silicon oxide layer 48 will only deposit on the exposed silicon oxide layer 42. A liquid phase deposition device is schematically shown in FIG. 5. Silicon substrates 51 placed on a carrier 50 are processed in a reactor 52 containing hydrofluosilic acid ($H_2SiF_6$) as a reactant. An injector 54 adds boric acid ($H_3BO_3$) into the reactor 52 to keep the hydrofluosilic acid saturated. Further, a stirrer 53 is used for stirring the reactant and a water bath 55 and a heater 56 are used for controlling the temperature inside the reactor 52 at an atmospheric temperature. See "A selective $SiO_2$, Film-Formation Technology Using Liquid-Phase Deposition for Fully Planarized Multilevel Interconnections," *J. Electrochem. Soc.*, Vol. 140, No. 8, August 1993.

Figure 4E:
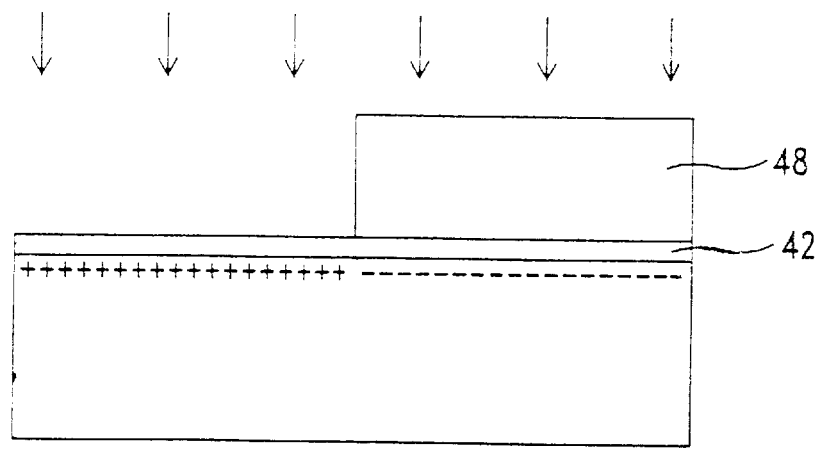

FIG. 4E shows the resulting structure after the photoresist mask 46 is stripped and the silicon nitride layer 44 is etched in a boiling phosphoric acid solution (85% $H_3PO_4$ at about 180° C.) using the silicon oxide layer 42 as an etch stop layer. Next, second-type ions such as the p-type ions of boron are implanted into the substrate 40 at 50~200 KeV with a dosage of about $1\times10^{18}$~$3\times10^{18}$ atoms/cm$^2$ using the LPD silicon oxide layer 48 as a mask.

Figure 4F:
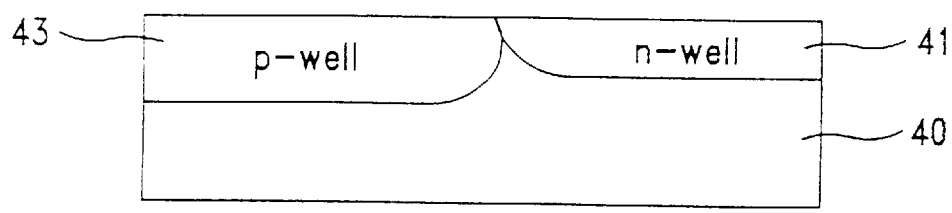

Referring to FIG. 4F, a drive-in process, also referred to as drive-in-oxidation, reoxidation or reox, is performed at a temperature of about 1000°~1200° C. to drive the dopant deeper into the substrate 40, forming an n-well 41 and a p-well 43. Finally the LPD silicon oxide layer 48, the silicon oxide layer 42 and a thin reoxidation layer (not shown) resulted from the previous drive-in step, are etched by, for example, immersing the structure of FIG. 4E in a dilute solution of hydrofluoric acid (HF) buffered with ammonia fluoride ($NH_4F$), also referred to as buffered-oxide etch (BOE).

According to the use of the LPD silicon oxide deposition, the n-well 41 and the p-well 43 thus formed have a near planar surface with height difference as low as 50 angstroms, making the fabrication of high-density circuits possible. It is well understood that the sequence of the ion-implant steps of the n-type ions and of the p-type ions in this preferred embodiment can be altered, i.e., implanting the p-type ions first and then implanting the n-type ions, without departing from the spirit of the present invention.

Figure 6A:
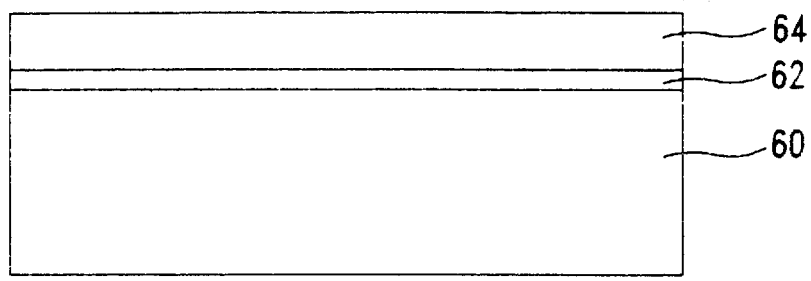
FIG. 6A to 6F illustrate schematically the cross-sections of the structure formed at various stages in forming the twin-tub wells in a semiconductor substrate according to another preferred embodiments of the present invention.

According to the present method, another embodiment is illustrate in FIG. 6A to FIG. 6F for forming twin-tub wells in a semiconductor substrate. FIG. 6A shows a schematic cross-section of a silicon substrate 60, which is n or p type, having thereon a silicon oxide layer 62 of 300~1000 angstroms in thickness. This silicon oxide layer 62 can be grown by using a conventional thermal oxidation process at about 900°~1100° C. Alternatively, the silicon oxide layer 62 can be formed by a chemical vapor deposition (CVD) method at a temperature as low as 400° C. A common method to deposit silicon oxide is oxidizing silane with oxygen at low pressure and low temperature (typically 400°~450° C.), and decomposing tetraethylorthosilicate (Si($C_2H_5O$)$_4$), also referred to as tetraethoxysilane (TEOS), at low pressure and at a temperature of about 650°~750° C. Thereafter, on top of the silicon oxide layer 62 is a silicon nitride layer 64 having a thickness of about 1000~3000 angstroms. This silicon nitride layer 64 will work as a mask to block implanted ions, which will be described later in conjunction with FIG. 6C. The silicon nitride layer 64 can be deposited by reacting silane with ammonia at about 700°~900° C. and at atmospheric pressure as follow:

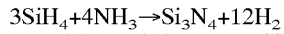
$3SiH_4 + 4NH_3 \rightarrow Si_3N_4 + 12H_2$

The silicon nitride layer 64 can alternatively be formed using a low pressure chemical vapor deposition (LPCVD) process by the reaction of dichlorosilane and ammonia at a temperature of about 700°~800° C. as follow:

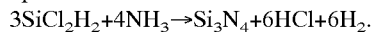
$3SiCl_2H_2 + 4NH_3 \rightarrow Si_3N_4 + 6HCl + 6H_2$.

Although a silicon nitride layer 64 is used as mentioned above, other dielectric layer such as a polysilicon layer can be used instead. The polysilicon layer 64 is typically deposited at low pressure (0.2~1.0 torr) by the pyrolitic decomposition of silane at 550°~650° C., following the reaction:

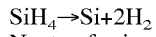
$SiH_4 \rightarrow Si + 2H_2$

Figure 6B:
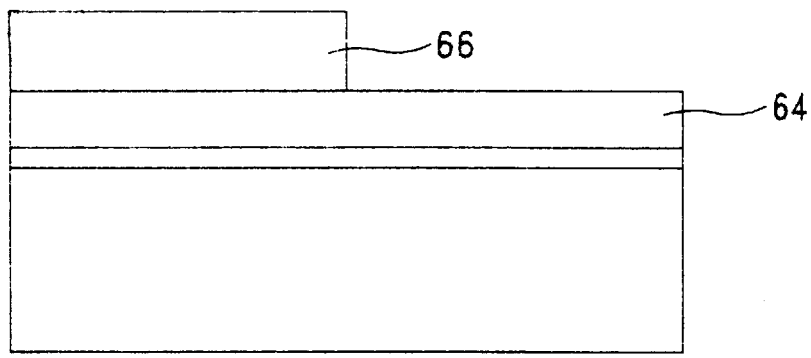

Next, referring to FIG. 6B, a pattern process is performed by applying a photoresist masking layer 66, covering a portion of the silicon nitride layer 64. This pattern process is defined using a standard photoresist coating, an exposure process and a development process. Afterward, the portion of the silicon nitride layer 64 not covered by the photoresist mask 66 is etched in a boiling phosphoric acid solution (85% $H_3PO_4$ at about 180° C.), forming the structure as shown in FIG. 6C.

Figure 6C:
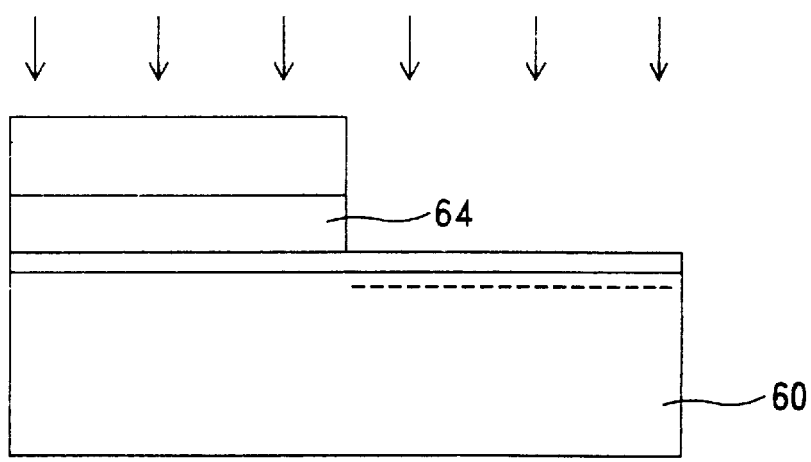

In FIG. 6C, first-type ions such as the n-type ions of phosphorus are implanted into the substrate 60 at 50~200 KeV with a dosage of about $1\times10^{18}$~$3\times10^{18}$ atoms/cm$^2$ using the silicon nitride layer 64 as a block.

Figure 6D:
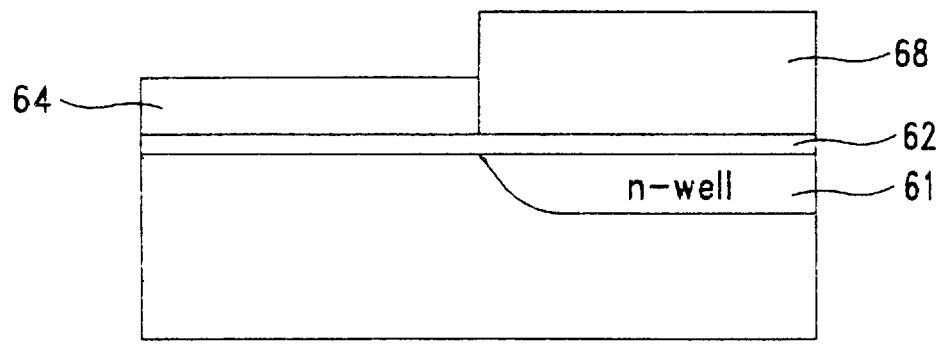

As illustrated in FIG. 6D, a thick silicon oxide layer 68 is selectively deposited on the silicon oxide layer 62 not covered by the silicon nitride layer 64 by a liquid phase deposition (LPD) method. Owing to its high deposition selectivity, the LPD silicon oxide layer 48 will only deposit on the exposed silicon oxide layer 62. A liquid phase deposition device is schematically shown in FIG. 5 and was described in the first preferred embodiment mentioned above. After the LPD silicon oxide layer 68 is deposited and the photoresist mask 66 is stripped, a drive-in process, also referred to as drive-in-oxidation, reoxidation or reox, is performed at a temperature of about 1200° C. to drive the dopant deeper into the substrate 60, forming an n-well 61.

Figure 6E:
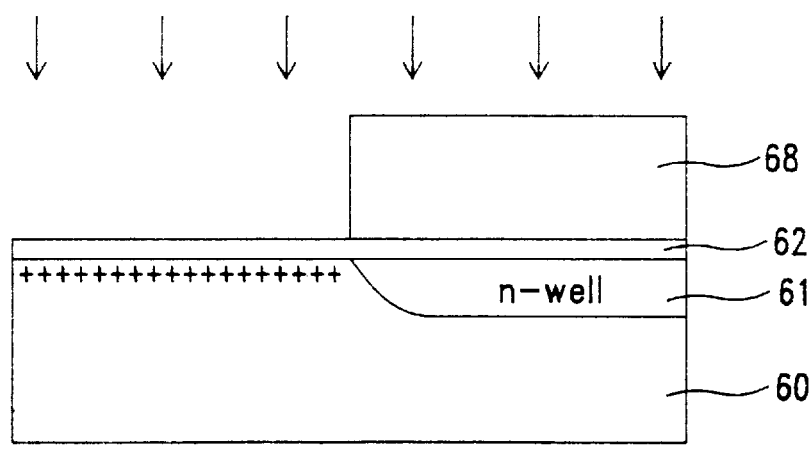

FIG. 6E shows the resulting structure after the silicon nitride layer 64 is etched in a boiling phosphoric acid solution (85% $H_3PO_4$ at about 180° C.) using the silicon oxide layer 62 as an etch stop layer. Next, second-type ions such as the p-type ions of boron are implanted into the substrate 60 at 50~200 KeV with a dosage of about $1\times10^{18}$~$3\times10^{18}$ atoms/cm$^2$ using the LPD silicon oxide layer 68 as a mask.

Figure 6F:
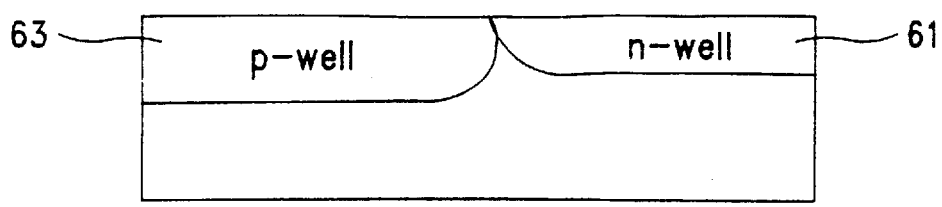

Referring to FIG. 6F, a drive-in process is performed at a temperature of about 1150° C. to drive the dopant deeper into the substrate 60, forming a p-well 63. Finally the LPD silicon oxide layer 68, the silicon oxide layer 62 and a thin reoxidation layer (not shown) resulted from the previous drive-in step, are etched by, for example, immersing the structure of FIG. 6E in a dilute solution of hydrofluoric acid (HF) buffered with ammonia fluoride ($NH_4F$), also referred to as buffered-oxide etch (BOE).

According to the use of the LPD silicon oxide deposition, the n-well 61 and the p-well 63 thus formed have a near planar surface with height difference as low as 50 angstroms, making the fabrication of high-density circuits possible. Furthermore, the depth of the n-well 61 and the depth of the p-well can be made almost equal by controlling the implant dosage, implant temperature and process time. It is well understood that the sequence of the ion-implant steps of the n-type ions and of the p-type ions in this preferred embodiment can be altered, i.e., implanting the p-type ions first and then implanting the n-type ions, without departing from the spirit of the present invention.

Although specific embodiments have been illustrated and described it will be obvious to those skilled in the art that various modification may be made without departing from the spirit which is intended to be limited solely by the appended claims.

CLAIMS

What is claimed is:

1. A method for forming twin-tub wells in a substrate, said method comprising:

forming a first silicon oxide layer on the substrate; patterning a silicon nitride layer on a portion of said first silicon oxide layer using a photoresist mask;

implanting a plurality of first-type ions over the substrate not covered by said silicon nitride layer;

forming a second silicon oxide layer on a portion of said first silicon oxide layer not covered by said silicon nitride layer, said second silicon oxide layer being formed by a liquid phase deposition;

driving-in the substrate such that a first-type well is formed under said first silicon oxide layer covered by said second silicon oxide layer, removing said silicon nitride layer; implanting a plurality of second-type ions over the substrate not covered by said second silicon oxide layer; and driving-in the substrate such that a second-type well is formed under said first silicon oxide layer not covered by said second silicon oxide layer.

2. The method according to claim 1, after the drive-in step, further comprising removing said second silicon oxide layer and said first silicon oxide layer.

3. The method according to claim 1, wherein the substrate is a p-type substrate.

4. The method according to claim 1, wherein the substrate is an n-type substrate.

5. A method for forming twin-tub wells in a substrate, said method comprising:

forming a first silicon oxide layer on the substrate;

patterning a dielectric layer on a portion of said first silicon oxide layer using a photoresist mask;

implanting a plurality of first-type ions over the substrate not covered by said dielectric layer;

forming a second silicon oxide layer on a portion of said first silicon oxide layer not covered by said dielectric layer, said second silicon oxide layer being formed by a liquid phase deposition;

driving-in the substrate such that a first-type well is formed under said first silicon oxide layer covered by said second silicon oxide layer;

removing said dielectric layer;

implanting a plurality of second-type ions over the substrate not covered by said second silicon oxide layer; and driving-in the substrate such that a second-type well is formed under said first silicon oxide layer not covered by said second silicon oxide layer.

6. The method according to claim 5, after the drive-in step, further comprising removing said second silicon oxide layer and said first silicon oxide layer.

7. The method according to claim 5, wherein the substrate is a P type substrate.

8. The method according to claim 5, wherein the substrate is an n-type substrate.

9. The method according to claim 5, wherein said dielectric layer is a polysilicon layer.

* * * * *